United States Patent
Yanagida

(10) Patent No.: US 8,018,031 B2
(45) Date of Patent: Sep. 13, 2011

(54) MOS TRANSISTORS FORMED ON THE FRONT AND BACK SURFACE OF A SEMICONDUCTOR SUBSTRATE

(75) Inventor: Masamichi Yanagida, Ota (JP)

(73) Assignees: Semiconductor Components Industries, LLC, Phoenix, AZ (US); SANYO Semiconductor Co., Ltd., Gunma (JP)

( * ) Notice: Subject to any disclaimer, the term of this patent is extended or adjusted under 35 U.S.C. 154(b) by 542 days.

(21) Appl. No.: 12/128,230

(22) Filed: May 28, 2008

(65) Prior Publication Data

US 2008/0296675 A1    Dec. 4, 2008

(30) Foreign Application Priority Data

May 29, 2007 (JP) ................................. 2007-142111

(51) Int. Cl.
*H01L 27/07* (2006.01)
(52) U.S. Cl. ................ 257/621; 257/329; 257/E27.029
(58) Field of Classification Search .................. 257/621
See application file for complete search history.

(56) References Cited

U.S. PATENT DOCUMENTS

| | | | | |
|---|---|---|---|---|
| 6,114,768 A | * | 9/2000 | Gaul et al. | 257/777 |
| 6,150,708 A | * | 11/2000 | Gardner et al. | 257/618 |
| 6,787,885 B2 | * | 9/2004 | Esser et al. | 257/627 |
| 7,202,140 B1 | * | 4/2007 | Ang et al. | 438/455 |
| 2004/0070047 A1 | * | 4/2004 | Majumdar et al. | 257/510 |
| 2010/0224876 A1 | * | 9/2010 | Zhu | 257/52 |

FOREIGN PATENT DOCUMENTS

JP    2001-119023    4/2001

* cited by examiner

*Primary Examiner* — Wael Fahmy
*Assistant Examiner* — Abul Kalam
(74) *Attorney, Agent, or Firm* — Morrison & Foerster LLP

(57) ABSTRACT

The invention realizes low on-resistance and high current flow in a semiconductor device in which a current flows in a thickness direction of a semiconductor substrate. A first MOS transistor having first gate electrodes and first source layers is formed on a front surface of a semiconductor substrate, and a second MOS transistor having second gate electrodes and second source layers is formed on a back surface thereof. A drain electrode connected to the semiconductor substrate, a first source electrode connected to the first source layers, a second source electrode connected to the second source layers, and a first penetration hole penetrating the semiconductor substrate are further formed. A first wiring connecting the first source electrode and the second source electrode is formed in the first penetration hole. The semiconductor substrate serves as a common drain region of the first and second MOS transistors.

4 Claims, 9 Drawing Sheets

MOS TRANSISTORS FORMED ON THE FRONT AND BACK SURFACE OF A SEMICONDUCTOR SUBSTRATE

CROSS-REFERENCE OF THE INVENTION

This application claims priority from Japanese Patent Application No. 2007-142111, the content of which is incorporated herein by reference in its entirety.

BACKGROUND OF THE INVENTION

1. Field of the Invention

The invention relates to a semiconductor device, in particular, a semiconductor device in which a current flows in a thickness direction of a semiconductor substrate.

2. Description of the Related Art

A trench type MOS transistor is known as a semiconductor device in which a current flows in a thickness direction of a semiconductor substrate, for example. This type of MOS transistor will be described referring to a cross-sectional view of FIG. 9, hereafter.

An $N^-$-type epitaxial layer 111 is formed on the front surface of an N-type semiconductor substrate 110. A P-type diffusion layer 112 which serves as a channel of a MOS transistor is formed on the front surface of this epitaxial layer 111. A plurality of trenches 113 having a predetermined depth is formed in the P-type diffusion layer 112 from the front surface to the back surface, and gate electrodes 114 are formed in these trenches 113. The gate electrodes 114 are covered by gate insulation films 115 on the front side of the P-type diffusion layer 112 and in the trenches 113. Source layers 116 made of N-type diffusion layers are formed adjacent to the gate electrodes 114 with the gate insulation films 115 being interposed therebetween. A P-type body layer 117 is formed between two adjacent source layers 116.

A source electrode 118 connected to the source layers 116 is formed on the front surface of the P-type diffusion layer 112. The surface of the semiconductor substrate 110 on the side where the epitaxial layer 111 is not formed is covered by a drain electrode 119.

In the MOS transistor having this structure, when a predetermined voltage is applied to the gate electrodes 114, a channel is formed in the P-type diffusion layer 112 along the trenches 113. A drift current flows through this channel in the thickness direction of the semiconductor substrate 110, that is, to the epitaxial layer 111, the semiconductor substrate 110 and the drain electrode 119.

The trench type MOS transistor is described in the Japanese Patent Application publication No. 2001-119023, for example.

The described MOS transistor has limitations in reducing on-resistance and realizing higher current flow due to a limitation in the density of the trenches 113 and the gate electrodes 114, that is, the number of the trenches 113 and the gate electrodes 114 per unit area.

SUMMARY OF THE INVENTION

The invention provides a semiconductor device including: a semiconductor substrate; a first MOS transistor formed on a front surface of the semiconductor substrate and having a first source and a first gate; a second MOS transistor formed on a back surface of the semiconductor substrate and having a second source and a second gate; a drain electrode electrically connected to the semiconductor substrate; a first source electrode electrically connected to the first source of the first MOS transistor; a second source electrode electrically connected to the second source of the second MOS transistor; and a first wiring formed through a first penetration hole formed in the semiconductor substrate and electrically connecting the first source electrode and the second source electrode, wherein the semiconductor substrate is a common drain of the first and second MOS transistors.

DETAILED DESCRIPTION OF THE INVENTION

Figure 1:
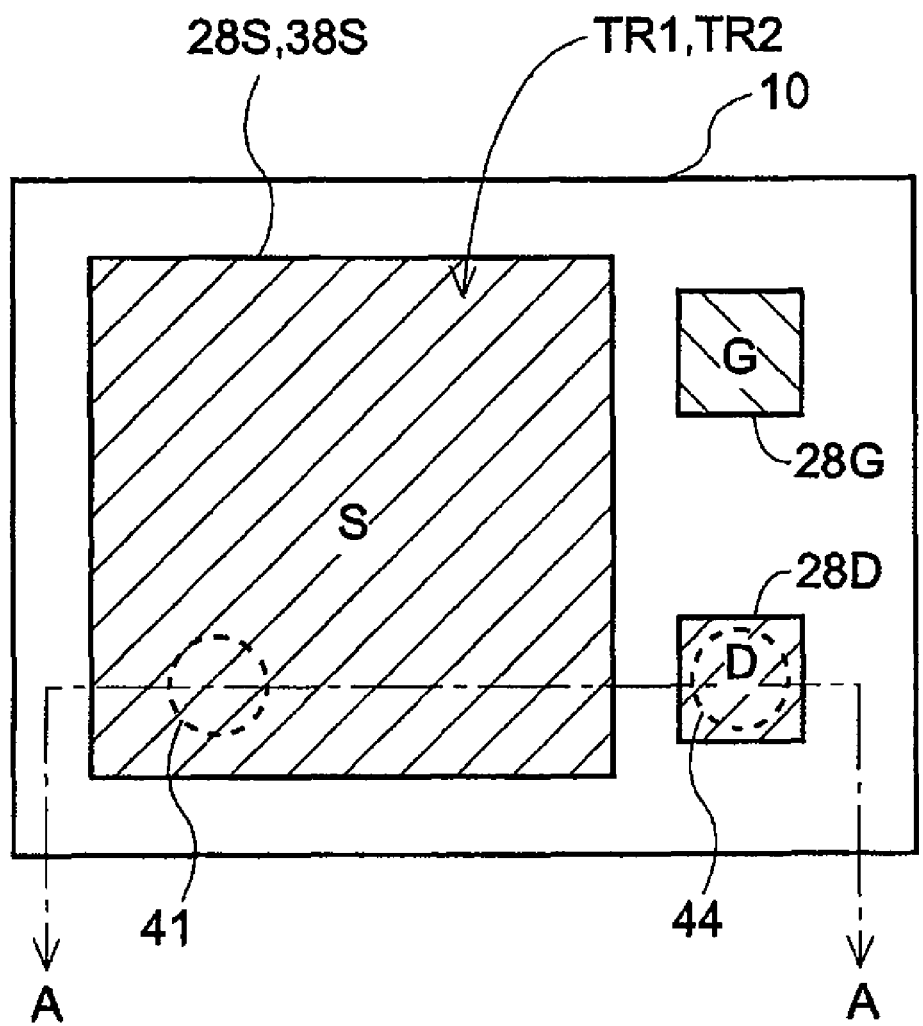
FIG. 1 is a schematic plan view showing a semiconductor device of a first embodiment of the invention.
Figure 2:
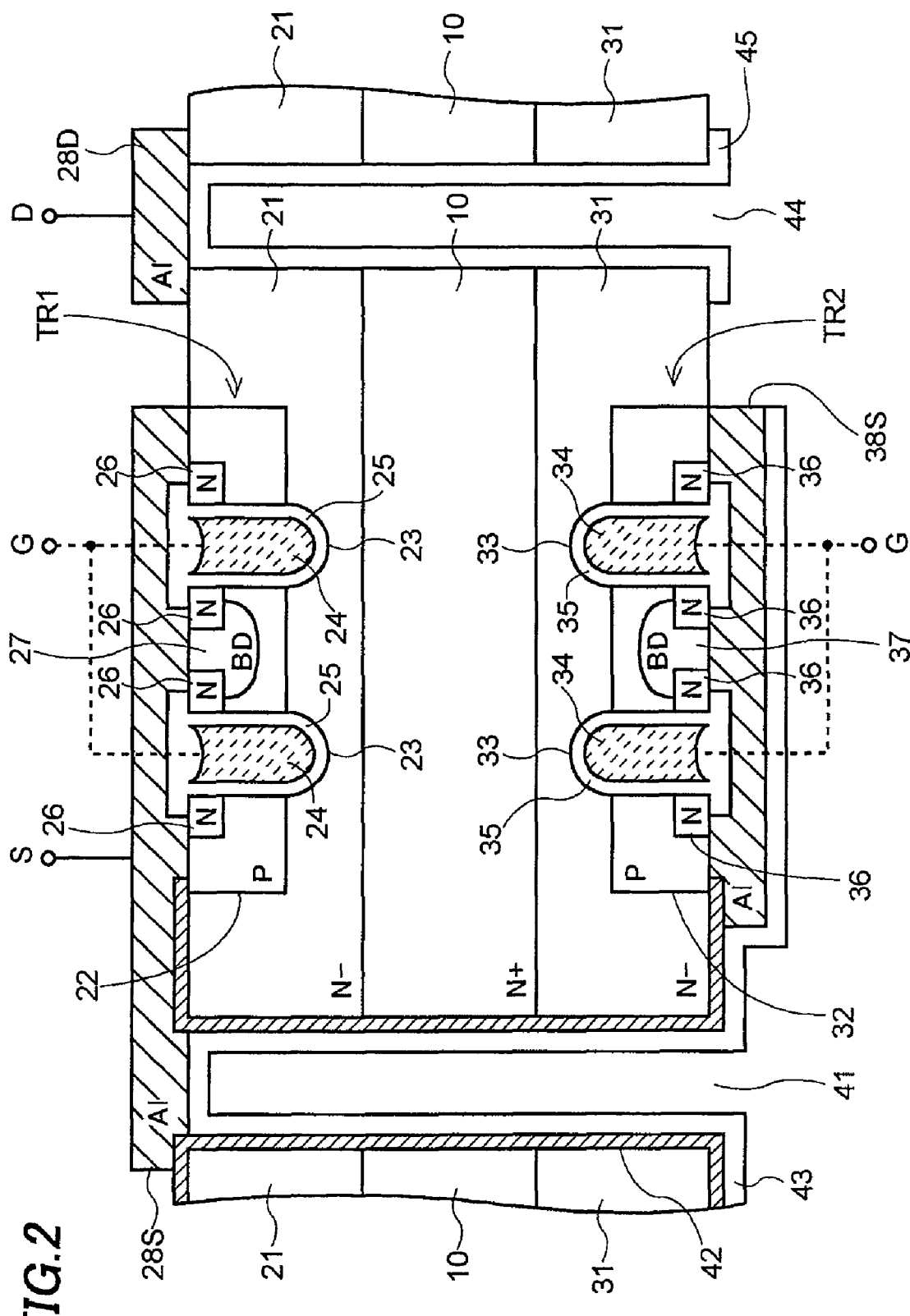
FIG. 2 is a cross-sectional view showing the semiconductor device of the first embodiment of the invention.

A first embodiment of the invention will be described referring to figures. FIG. 1 is a schematic plan view showing a semiconductor device of the embodiment. FIG. 2 is a cross-sectional view of FIG. 1 along line A-A.

First, the structure of the semiconductor device of the embodiment will be described in the schematic plan view. In this semiconductor device, a first MOS transistor TR1 is formed on the front surface of a semiconductor substrate 10, and a second MOS transistor TR2 is formed on the back surface of the semiconductor substrate 10, being opposed to the first MOS transistor TR1. The regions where the first MOS transistor TR1 and the second MOS transistor TR2 are formed are covered by a first source electrode 28S and a second source electrode 38S, respectively. A gate terminal 28G and a drain electrode 28D are disposed in a region adjacent to the first source electrode 28S and the second source electrode 38S. The positional relation of the first source electrode 28S, the second source electrode 38S, the gate terminal 28G and the drain electrode 28D are not limited to that shown in FIG. 1, and may be appropriately changed according to needs.

The cross-sectional structure of this semiconductor device will be described in detail, hereafter. The first MOS transistor TR1 is formed on the front surface of the semiconductor substrate 10 made of, for example, an $N^+$-type silicon substrate. In detail, an $N^-$-type first epitaxial layer 21 is formed on the front surface of the semiconductor substrate 10, and a first P-type diffusion layer 22 which serves as the channel of the first MOS transistor TR1 is formed on the front surface of the first epitaxial layer 21.

First trenches 23 are formed in the first P-type diffusion layer 22 from its front surface to the first epitaxial layer 21, and first gate electrodes 24 made of, for example, polysilicon are formed in the first trenches 23. Although a single first trench 23 or a plurality of first trenches 23 may be formed, only two trenches 23 are shown in this embodiment for simplicity of description. The depth of the first trenches 23 is about 2 μm, and the opening diameter thereof is about 0.4 μm, for example. The first gate electrodes 24 are covered by first gate insulation films 25 on the front side of the first P-type diffusion layer 22 and in the first trenches 23. The first gate electrodes 24 are connected to the gate terminal 28G shown in FIG. 1.

N-type first source layers 26 are formed adjacent to the first gate electrodes 24 in the first P-type diffusion layer 22 with the first gate insulation films 25 being interposed therebetween. A first P-type body layer 27 is formed between the adjacent two first source layers 26.

The front surface of the first P-type diffusion layer 22 is covered by the first source electrode 28S made of a metal layer of aluminum, an aluminum alloy or the like and connected to the first source layers 26. The first source electrode 28S is extended to a position overlapping a region where a first penetration hole 41 which will be described below is formed. The drain electrode 28D made of a metal layer of aluminum, an aluminum alloy or the like is formed on the front surface of the semiconductor substrate 10 in the region where the first P-type diffusion layer 22 is not formed, and the drain electrode 28D is electrically connected to the semiconductor substrate 10.

The second MOS transistor TR2 having the same structure as the first MOS transistor TR1 is formed on the back surface of the semiconductor substrate 10. In detail, in the similar manner to the first MOS transistor TR1, a second epitaxial layer 31, a second P-type diffusion layer 32, second trenches 33, second gate electrodes 34, second gate insulation films 35, second source layers 36, a second P-type body layer 37 and the second source electrode 38S are formed.

The first penetration hole 41 is further formed penetrating the first epitaxial layer 21, the semiconductor substrate 10 and the second epitaxial layer 31. The first penetration hole 41 overlaps the first source electrode 28S. The opening diameter of the first penetration hole 41 is about 25 μm, for example. An insulation film 42 made of a silicon oxide film, a silicon nitride film or the like is formed on the sidewall of the first penetration hole 41 and on the second epitaxial layer 31 around the opening of the first penetration hole 41.

A first wiring 43 is further formed from the inside of the first penetration hole 41 onto the second source electrode 38S. The first wiring 43 is insulated from the first epitaxial layer 21, the semiconductor substrate 10 and the second epitaxial layer 31 by the insulation film 42 and connected to the first source electrode 28S in the first penetration hole 41 and to the second source electrode 38S on the outside of the first penetration hole 41. The first wiring 43 is a metal layer made of, for example, aluminum, an aluminum alloy or copper.

It is noted that the first penetration hole 41 may overlap or not overlap the first source electrode 28S and the second source electrode 38S as long as the first source electrode 28S and the second source electrode 38S are electrically connected by the first wiring 43 through the first penetration hole 41. In the case where the first penetration hole 41 does not overlap the first source electrode 28S, the first wiring 43 is extended to the outside of the first penetration hole 41, that is, onto the front surface of the first epitaxial layer 21 so as to be connected to the first source electrode 28S. The size of the first penetration hole 41 is not particularly limited, and a plurality of first penetration holes 41 may be provided without limitation to a single first penetration hole 41 as shown in the figure.

A second penetration hole 44 is formed penetrating the first epitaxial layer 21, the semiconductor substrate 10 and the second epitaxial layer 31. The opening diameter of the second penetration hole 44 is about 25 to 30 μm, for example. A second wiring 45 is formed in the second penetration hole 44 without an insulation film therebetween. The second wiring 45 is connected to the first epitaxial layer 21, the semiconductor substrate 10 and the second epitaxial layer 31 in the second penetration hole 44, and also connected to the drain electrode 28D. This reduces drain resistance. The second wiring 45 is a metal layer made of, for example, aluminum, an aluminum alloy or copper.

The second penetration hole 44 preferably overlaps the drain electrode 28D, but the second penetration hole 44 may be connected to the drain electrode 28D without overlapping the drain electrode 28D by extending the second wiring 45 to the outside of the second penetration hole 44, that is, to the front surface of the first epitaxial layer 21. The size of the second penetration hole 44 is not particularly limited, and a plurality of holes 44 may be provided without limitation to a single hole 44 as shown in the figure.

In the described structure, the semiconductor substrate 10 and the first epitaxial layer 21 serve as the drain region of the first MOS transistor TR1. In detail, when a predetermined voltage is applied to the first gate electrodes 24, a channel is formed along the first trenches 23 in the first P-type diffusion layer 22. A drift current flows in the thickness direction of the semiconductor substrate 10, that is, to the first epitaxial layer 21 and the semiconductor substrate 10 through this channel, and the current is outputted as a drain current from the drain electrode 28D through the second wiring 45. Similarly, the semiconductor substrate 10 and the second epitaxial layer 31 serve as the drain region of the second MOS transistor TR2, and a drift current flowing therethrough is outputted as a drain current from the drain electrode 28D through the second wiring 45.

The first MOS transistor TR1 and the second MOS transistor TR2 thus share the semiconductor substrate 10 as the drain region. This enables outputting of a drain current on a short route, thereby preventing increase of on-resistance. Furthermore, since the MOS transistors are formed on both the sides of the semiconductor substrate 10, the number of channels per unit area is doubled over the number of the case where the MOS transistor is formed on one side, thereby realizing high current flow. This means realizing a semiconductor device with smaller size which enables desired current flow.

Figure 3:
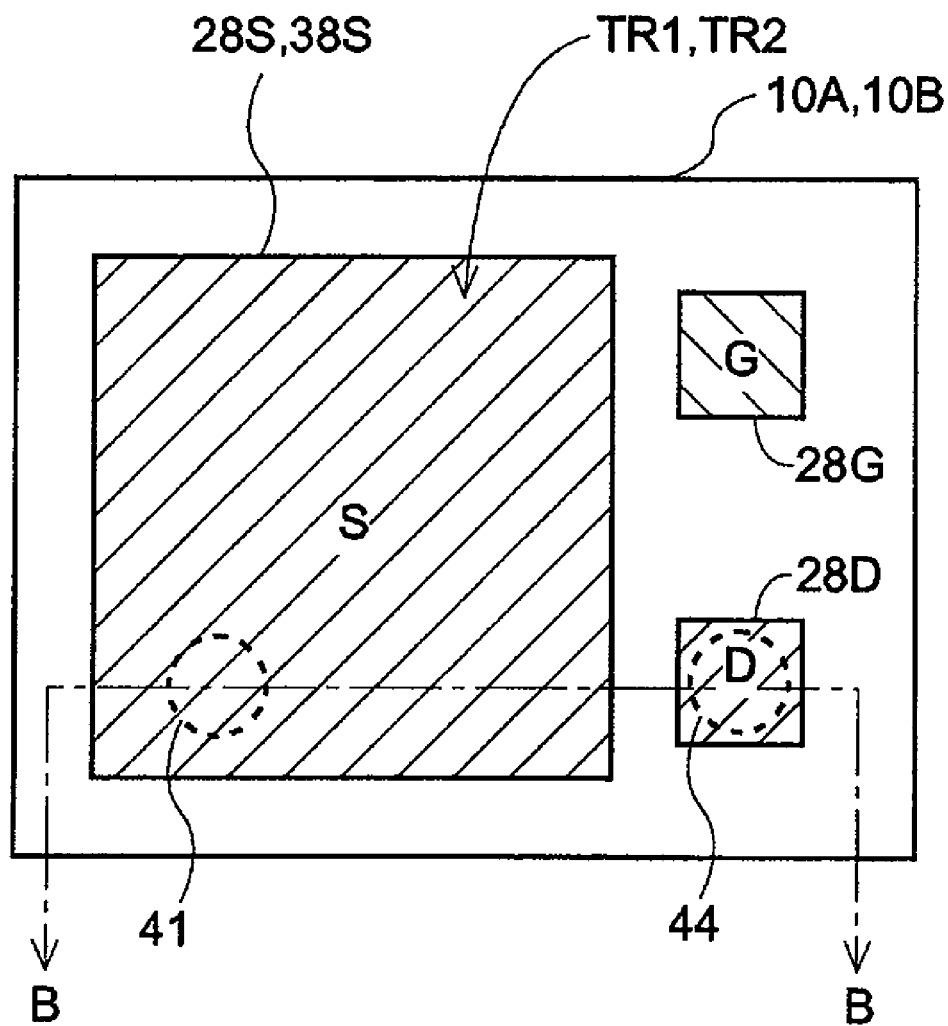
FIG. 3 is a schematic plan view showing a semiconductor device of second and third embodiments of the invention.
Figure 4:
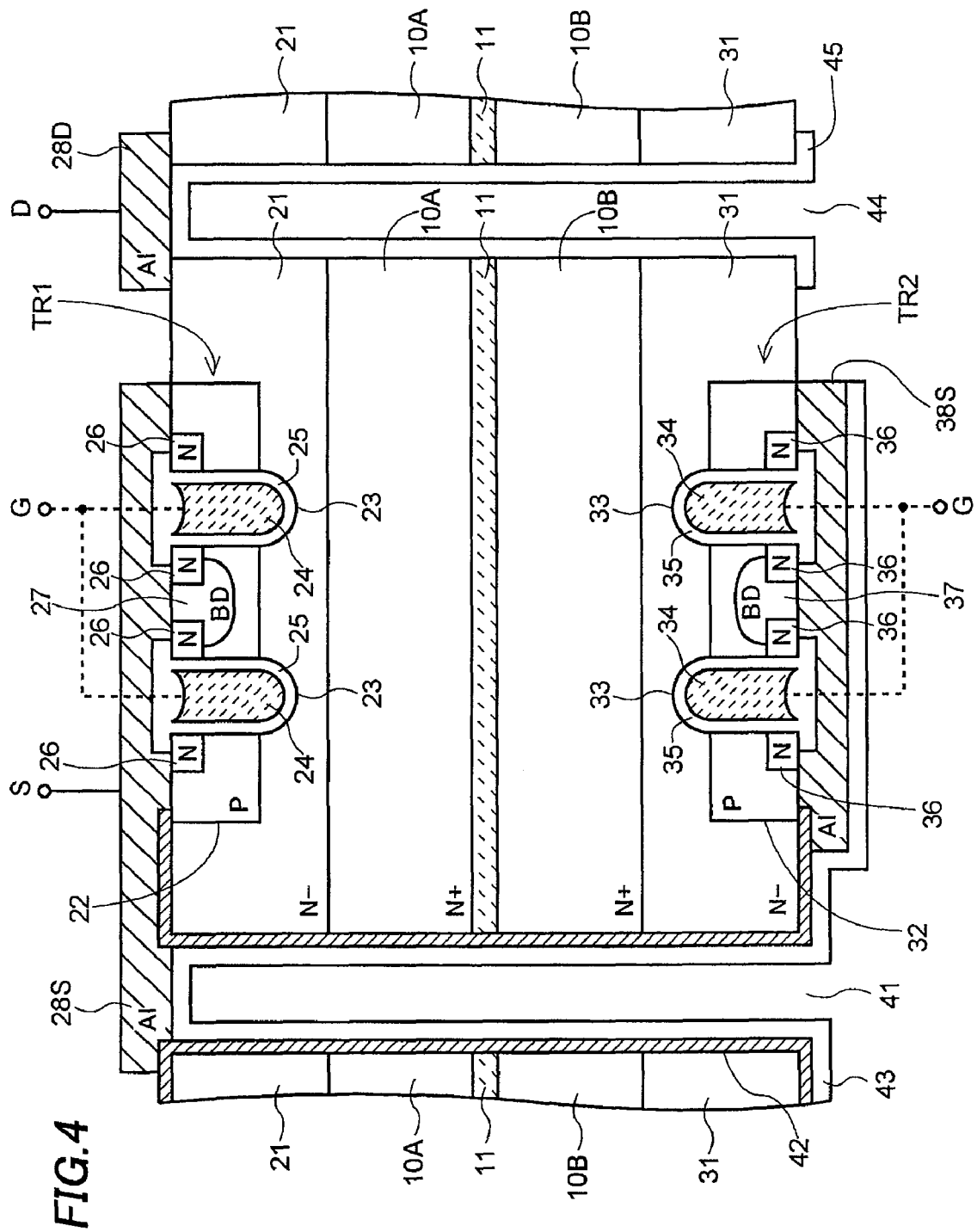
FIG. 4 is a cross-sectional view showing the semiconductor device of the second embodiment of the invention.

A second embodiment of the invention will be described referring to figures. FIG. 3 is a schematic plan view showing a semiconductor device of this embodiment, and FIG. 4 is a cross-sectional view of FIG. 3 along line B-B. In FIGS. 3 and 4, the same numerals are given to the same components as those of the first embodiment shown in FIGS. 1 and 2 and a description thereof will be omitted.

In this semiconductor device, the first MOS transistor TR1 is formed on a first semiconductor substrate 10A, and the second MOS transistor TR2 is formed on a second semiconductor substrate 10B which is formed separately from the first semiconductor substrate 10A. Then, the first semiconductor substrate 10A and the second semiconductor substrate 10B are attached with an adhesive layer 11, with the sides where the first epitaxial layer 21 and the second epitaxial layer 31 are not formed being faced to each other. The adhesive layer 11 is made of a conductive paste such as a silver paste, and electrically connects the first semiconductor substrate 10A and the second semiconductor substrate 10B. Therefore, the first semiconductor substrate 10A and the second semiconductor substrate 10B serve as the common drain region of the first MOS transistor TR1 and the second MOS transistor TR2.

The same first penetration hole 41 as in the first embodiment is formed in the first epitaxial layer 21, the first semiconductor substrate 10A, the second semiconductor substrate 10B and the second epitaxial layer 31. The insulation film 42 is formed on the sidewall of the first penetration hole 41 and on the second epitaxial layer 31 around the opening of the first penetration hole 41.

The same first wiring 43 as in the first embodiment is further formed from the inside of the first penetration hole 41 onto the second source electrode 38S. That is, the first wiring 43 is connected to the first source electrode 28S in the first penetration hole 41, and connected to the second source electrode 38S on the outside of the first penetration hole 41.

The same second penetration hole 44 as in the first embodiment is further formed in the first epitaxial layer 21, the first semiconductor substrate 10A, the second semiconductor substrate 10B and the second epitaxial layer 31. The same second wiring 45 as in the first embodiment is formed in the second penetration hole 44 without the insulation film therebetween. It means that the second wiring 45 is connected to the first epitaxial layer 21, the first semiconductor substrate 10A, the second semiconductor substrate 10B and the second epitaxial layer 31 in the second penetration hole 44, and also connected to the drain electrode 28D.

In this embodiment, the first MOS transistor TR1 and the second MOS transistor TR2 are formed on the separate semiconductor substrates respectively, so that the common manufacturing process is applicable thereto. This prevents increase of the manufacturing cost as well as provides the same effect as in the first embodiment.

The first MOS transistor TR1 and the second MOS transistor TR2 of the second embodiment may be formed as insulated gate bipolar transistors (IGBT).

Figure 5:
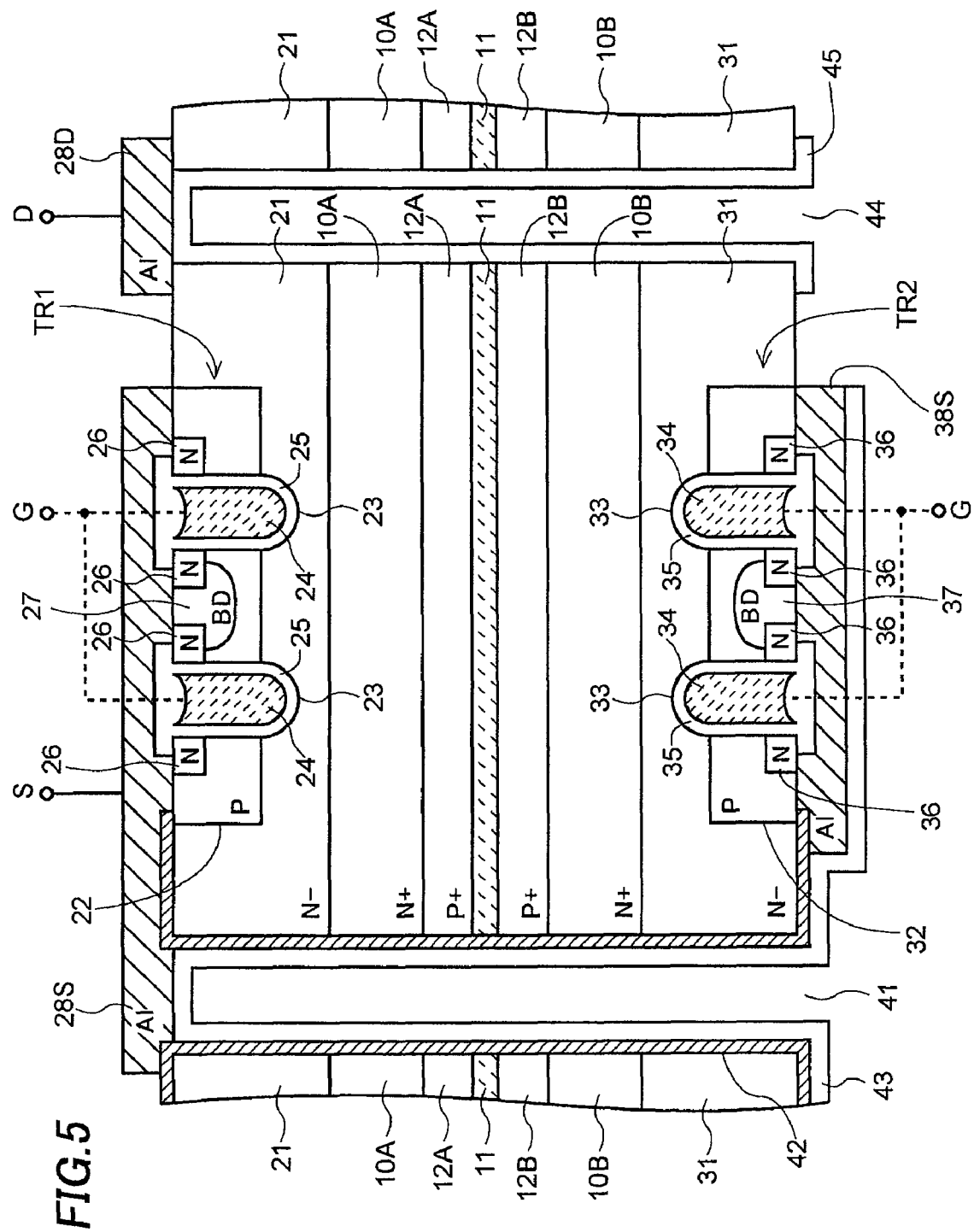
FIG. 5 is a cross-sectional view showing the semiconductor device of the third embodiment of the invention.

This case will be described hereafter as a third embodiment of the invention referring to a figure. FIG. 5 is a cross-sectional view showing a semiconductor device of this embodiment. The structure in a schematic plan view is the same as in the second embodiment. In FIG. 5, the same numerals are given to the same components as those of the second embodiment shown in FIGS. 3 and 4 and a description thereof will be omitted.

In this semiconductor device, a P-type high concentration diffusion layer or a first P$^+$-type diffusion layer 12A is formed on the first semiconductor substrate 10A on the side where the first epitaxial layer 21 is not formed. Similarly, a second P$^+$-type diffusion layer 12B is formed on the second semiconductor substrate 10B on the side where the second epitaxial layer 31 is not formed.

This structure provides the first MOS transistor TR1 and the second MOS transistor TR2 with advantages of dynamic characteristics of a bipolar transistor for high current drive and a MOS transistor for high speed switching, as insulated gate bipolar transistors, as well as the effect of the first and second embodiments.

Although the descriptions of the first to third embodiments are given using the trench type MOS transistors in which the first trenches 23 and the second trenches 33 are formed, the invention is also applicable to other type of MOS transistor as long as it is a transistor in which a current flows in a thickness direction of a semiconductor substrate.

Figure 6:
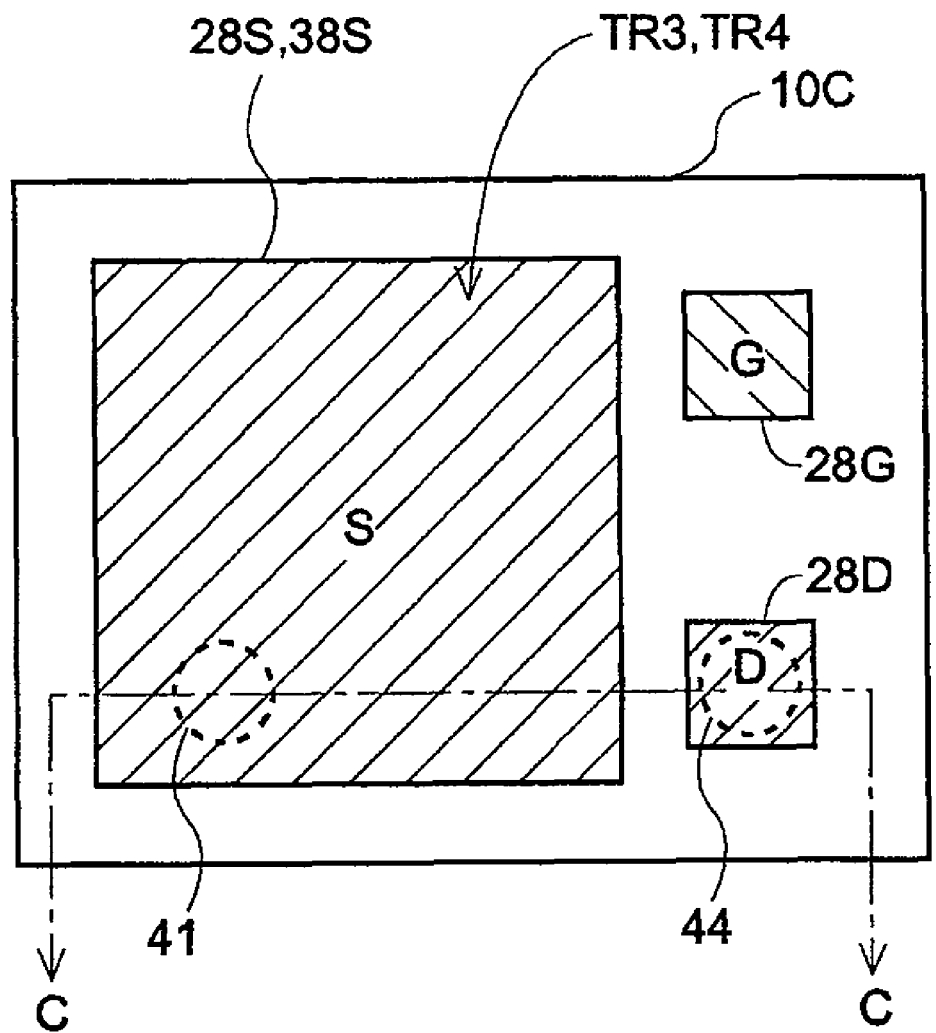
FIG. 6 is a schematic plan view showing a semiconductor device of a fourth embodiment of the invention.
Figure 7:
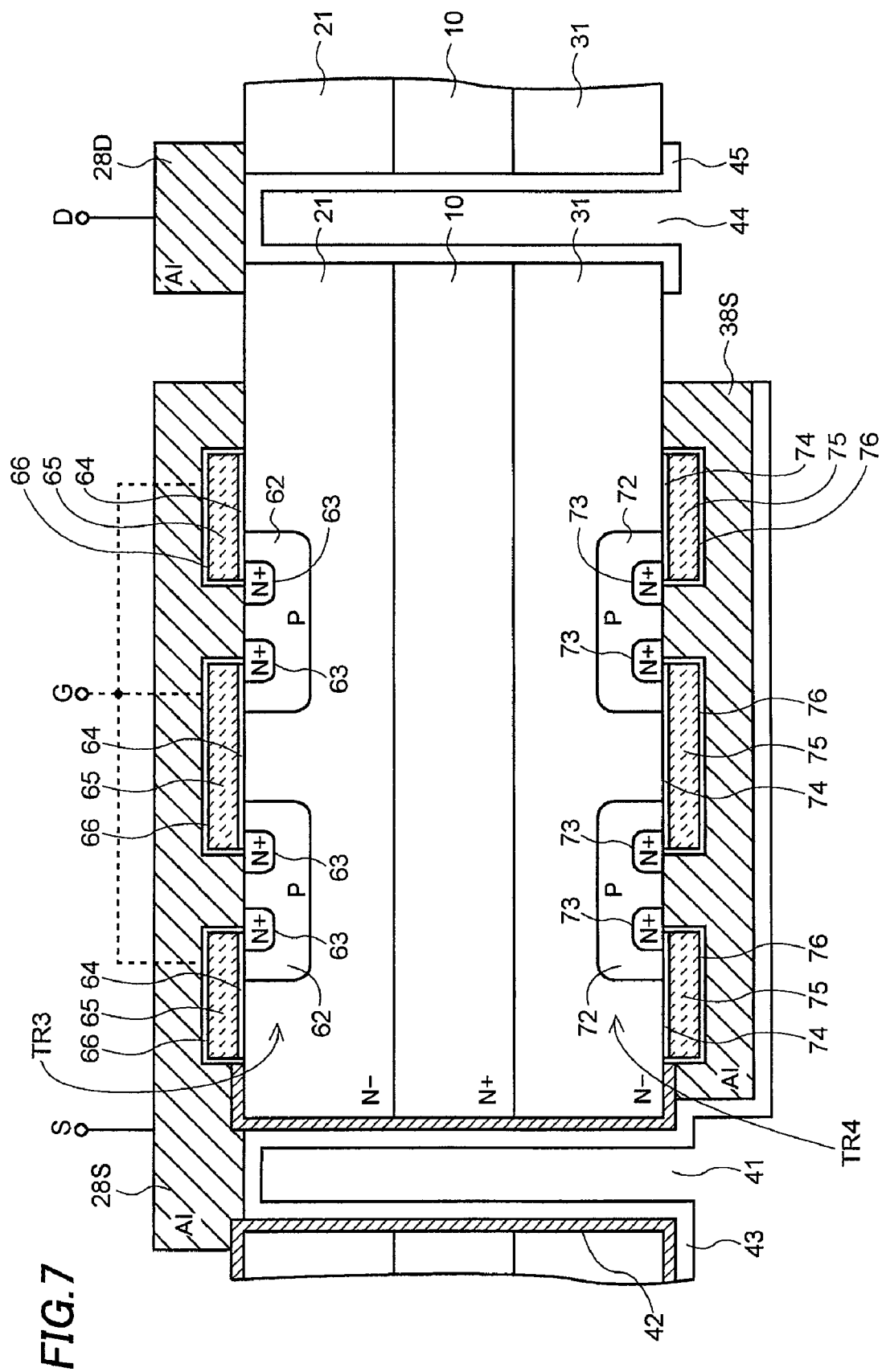
FIG. 7 is a cross-sectional view showing the semiconductor device of the fourth embodiment of the invention.

A fourth embodiment of the invention will be described hereafter referring to figures. FIG. 6 is a schematic plan view showing a semiconductor device of this embodiment, and FIG. 7 is a cross-sectional view of FIG. 6 along line C-C. In FIGS. 6 and 7, the same numerals are given to the same components as those of the first embodiment shown in FIGS. 1 and 2 and a description thereof will be omitted.

In this semiconductor device, an N-type first epitaxial layer 21 is formed on the front surface of the semiconductor substrate 10, and third P-type diffusion layers 62 which serve as a channel of a third MOS transistor TR3 are further formed. N$^+$-type third source layers 63 are formed on the front surface of the third P-type diffusion layers 62. Third gate insulation films 64 are formed partially on the third P-type diffusion layers 62 and the third source layers 63 on the front surface of the semiconductor substrate 10. Third gate electrodes 65 are formed on the third gate insulation films 64, overlapping the third P-type diffusion layers 62 and the third source layers 63. The third gate electrodes 65 are covered by insulation films 66. Furthermore, the same first source electrode 28S as in the first embodiment is formed on the front surface of the semiconductor substrate 10, being connected to the third source layers 63.

Similarly, the second epitaxial layer 31, fourth P-type diffusion layers 72, fourth source layers 73, fourth gate insulation films 74, fourth gate electrodes 75, insulation films 76 and the second source electrode 38S are formed on the back surface of the semiconductor substrate 10. That is, a fourth MOS transistor TR4 is formed.

In the similar manner to the first embodiment, the first penetration hole 41, the insulation film 42 and the first wiring 43 are formed in the semiconductor substrate 10. The first wiring 43 is insulated from the semiconductor substrate 10 and connects the first source electrode 28S and the second source electrode 38S.

In the similar manner to the first embodiment, the second penetration hole 44 and the second wiring 45 are formed in the semiconductor substrate 10. The second wiring 45 is connected to the semiconductor substrate 10 and also connected to the drain electrode 28D.

Although not shown, as the structure having the same effect as in the second embodiment, the third MOS transistor TR3 and the fourth MOS transistor TR4 may be formed on the separately provided two semiconductor substrates, respectively. In this case, the semiconductor substrates are attached with an adhesive layer made of a conductive paste such as a silver paste, with the sides where the third P-type diffusion layers 62 and the fourth P-type diffusion layers 72 are not formed being faced to each other.

In addition to this structure, as the structure having the same effect as in the third embodiment, the third MOS transistor TR3 and the fourth MOS transistor TR4 may be formed as insulated gate bipolar transistors. In detail, P-type high concentration diffusion layers or P$^+$-type diffusion layers may be formed on the semiconductor substrates respectively on the sides where the third P-type diffusion layers 62 and the fourth P-type diffusion layers 72 are not formed.

Figure 8:
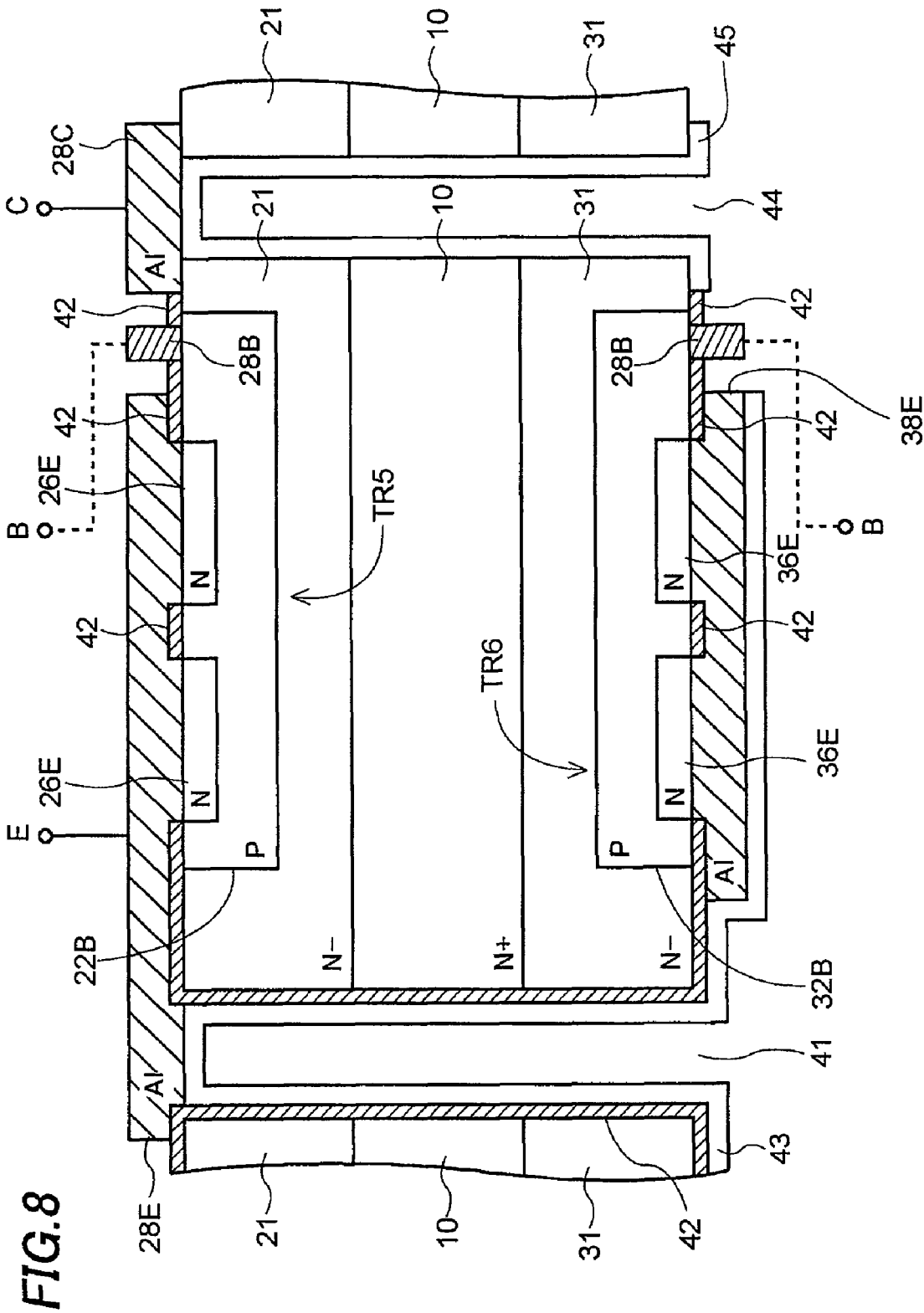
FIG. 8 is a cross-sectional view showing a semiconductor device of a fifth embodiment of the invention.
Figure 9:
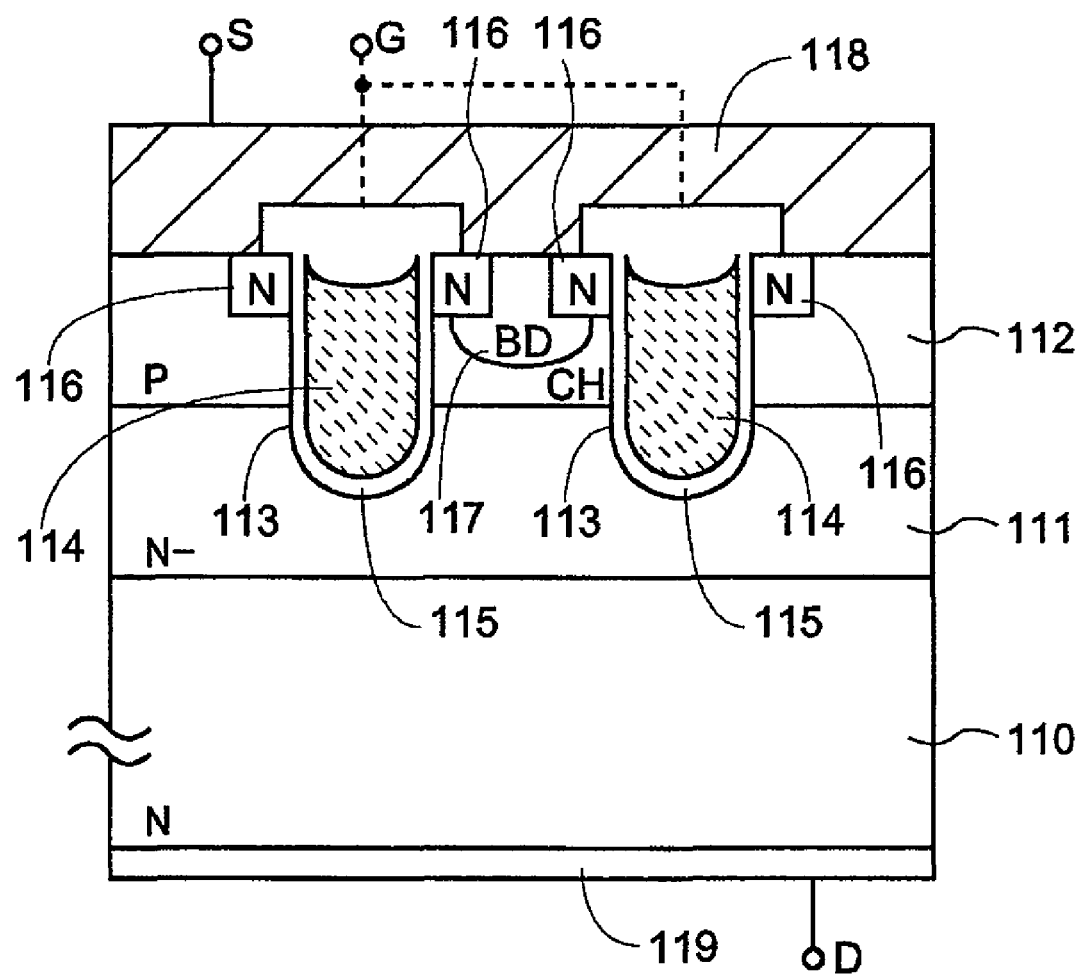
FIG. 9 is a cross-sectional view showing a conventional semiconductor device.

Furthermore, the invention is also applicable to other transistor than above, for example, a bipolar transistor, as long as it is a transistor in which a current flows in a thickness direction of a semiconductor substrate. Hereafter, a fifth embodiment of the invention will be described referring to a figure. FIG. 8 is a cross-sectional view showing a semiconductor device of this embodiment. In FIG. 8, the same numerals are given to the same components as those of the first embodiment shown in FIGS. 1 and 2 and a description thereof will be omitted.

In this semiconductor device, the first epitaxial layer 21 is formed on the front surface of the semiconductor substrate 10, and a first P-type diffusion layer 22B which serves as a base of a first bipolar transistor TR5 is further formed. N$^+$-type first emitter layers 26E are formed on the front surface of the first P-type diffusion layer 22B. A first emitter electrode 28E connected to the first emitter layers 26E is formed on the front surface of the semiconductor substrate 10. The first P-type diffusion layer 22B and the first emitter electrode 28E are insulated from each other by insulation films 42. A part of the first P-type diffusion layer 22B is connected to a base electrode 28B connected to the base potential.

Similarly, the second epitaxial layer 31, a second P-type diffusion layer 32B, second emitter layers 36E, a second emitter electrode 38E, a base electrode 28B and insulation films 42 are formed on the back surface of the semiconductor substrate 10. That is, a second bipolar transistor TR6 is formed.

In the similar manner to the first embodiment, the first penetration hole 41, the insulation film 42 and the first wiring 43 are formed in the first epitaxial layer 21, the semiconductor substrate 10 and the second epitaxial layer 31. The first wiring 43 is insulated from the semiconductor substrate 10 and connects the first emitter electrode 28E and the second emitter electrode 38E.

Furthermore, in the similar manner to the first embodiment, the second penetration hole 44 and the second wiring 45 are formed in the first epitaxial layer 21, the semiconductor substrate 10 and the second epitaxial layer 31. The second wiring 45 is connected to the semiconductor substrate 10 and also connected to a collector electrode 28C.

Although not shown, in the described first to third embodiments, the first gate electrodes 24 and the second gate electrodes 34 may be connected to each other with wiring through another penetration hole. This is applicable to the third gate electrodes 65 and the fourth gate electrodes 75 in the fourth embodiment, and the two base electrodes 28B in the fifth embodiment.

The invention realizes low on-resistance and high current flow in a semiconductor device in which a current flows in a thickness direction of a semiconductor substrate.

What is claimed is:

1. A semiconductor device comprising:
   a semiconductor substrate;
   a first MOS transistor formed on a front surface of the semiconductor substrate and comprising a first source and a first gate;
   a second MOS transistor formed on a back surface of the semiconductor substrate and comprising a second source and a second gate;
   a drain electrode formed on and electrically connected to the semiconductor substrate;
   a first source electrode formed on the front surface and electrically connected to the first source of the first MOS transistor;
   a second source electrode formed on the back surface and electrically connected to the second source of the second MOS transistor; and
   a first wiring formed in a first penetration hole penetrating the semiconductor substrate and electrically connecting the first source electrode and the second source electrode,
   wherein the semiconductor substrate is configured to operate as a common drain of the first and second MOS transistors.

2. The semiconductor device of claim 1, further comprising a second wiring formed in a second penetration hole penetrating the semiconductor substrate and electrically connected to the drain electrode.

3. The semiconductor device of claim 1, wherein the first wiring is electrically insulated from the semiconductor substrate.

4. The semiconductor device of claim 2, wherein the first wiring is electrically insulated from the semiconductor substrate.

* * * * *